US009896277B2

(12) United States Patent
Shimizu et al.

(10) Patent No.: US 9,896,277 B2
(45) Date of Patent: Feb. 20, 2018

(54) COMPONENT SUPPLY DEVICE

(71) Applicant: FUJI MACHINE MFG. CO., LTD., Chiryu (JP)

(72) Inventors: Toshinori Shimizu, Kariya (JP); Hiroyasu Ohashi, Toyota (JP); Toshihiko Yamasaki, Nisshin (JP); Masaki Murai, Nishio (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 14/438,462

(22) PCT Filed: Oct. 29, 2012

(86) PCT No.: PCT/JP2012/077900
§ 371 (c)(1),
(2) Date: Apr. 24, 2015

(87) PCT Pub. No.: WO2014/068638
PCT Pub. Date: May 8, 2014

(65) Prior Publication Data
US 2015/0274435 A1    Oct. 1, 2015

(51) Int. Cl.
*H01L 21/677*    (2006.01)
*B65G 47/06*    (2006.01)
(Continued)

(52) U.S. Cl.
CPC ........ *B65G 47/06* (2013.01); *H01L 21/67721* (2013.01); *H01L 21/67724* (2013.01);
(Continued)

(58) Field of Classification Search
CPC .. H05K 13/021; H05K 13/0434; H05K 13/02; H01L 21/67721; H01L 21/67724; H01L 21/67775
(Continued)

(56) References Cited

U.S. PATENT DOCUMENTS 5,839,187 A * 11/1998 Sato ................... H01L 21/67144
29/743
6,692,214 B1 * 2/2004 Shida ..................... B65G 47/06
198/468.9
(Continued)

FOREIGN PATENT DOCUMENTS

JP    06-190647    *    7/1994
JP    06-190647 A        7/1994
(Continued)

OTHER PUBLICATIONS

International Search Report dated Nov. 20, 2012 in PCT/JP2012/077900 Filed Oct. 29, 2012.

*Primary Examiner* — Gerald McClain
*Assistant Examiner* — Ronald Jarrett
(74) *Attorney, Agent, or Firm* — Oblon, McClelland, Maier & Neustadt, L.L.P.

(57) ABSTRACT

A component supply device is arranged adjacent to a mounter which mounts components on a board and supplies components to the mounter. This component supply device includes a replenishment section provided with a magazine which houses a component carrying member on which multiple components are arranged on a base material, and a conveyance section which conveys a component carrying member housed in the magazine and which is equipped with side surface number one to which the replenishment section is attached and side surface number two which is arranged adjacent to the mounter. The replenishment section is slidably attached with respect to side surface number one of the conveyance section.

7 Claims, 12 Drawing Sheets

(51) Int. Cl.
  *H05K 13/02* (2006.01)
  *H05K 13/04* (2006.01)
  *H01L 23/00* (2006.01)

(52) U.S. Cl.
  CPC ..... *H01L 21/67775* (2013.01); *H05K 13/021* (2013.01); *H05K 13/0434* (2013.01); *H01L 24/75* (2013.01); *H01L 2224/7565* (2013.01)

(58) Field of Classification Search
  USPC ........................................................ 384/619
  See application file for complete search history.

(56) References Cited

U.S. PATENT DOCUMENTS

| | | | |
|---|---|---|---|
| 2002/0141667 A1* | 10/2002 | Ishihara | F16C 29/0657 384/45 |
| 2008/0218772 A1* | 9/2008 | Binns | H01L 21/67201 356/622 |
| 2012/0100709 A1* | 4/2012 | Minami | C25D 17/00 438/597 |
| 2012/0266457 A1* | 10/2012 | Hanamura | H05K 13/0061 29/739 |

FOREIGN PATENT DOCUMENTS

| | | | | |
|---|---|---|---|---|
| JP | 2000-114204 A | | 4/2000 | |
| JP | 2003-174061 A | | 6/2003 | |
| JP | 2009-032964 A | | 2/2009 | |
| JP | 2009-105352 A | | 5/2009 | |
| WO | WO2011083553 | * | 7/2011 | .............. B23P 19/00 |

\* cited by examiner

COMPONENT SUPPLY DEVICE

TECHNICAL FIELD

The technology disclosed in this specification relates to a component supply device which supplies components to a mounter which mounts components on a board.

BACKGROUND ART

Component supply devices are arranged adjacent to mounters and supply components to be mounted on a board to a mounter. Mounters mount components supplied from a component supply device on a board. A component supply device using conventional technology is disclosed, for example, in Japanese Unexamined Patent Application Publication Number 2000-114204.

BRIEF SUMMARY

Problem to be Solved

As mentioned above, a component supply device is arranged adjacent to a mounter. Due to this, when a problem arises with the mounter, an operator must access inside the mounter while avoiding the component supply device to resolve the problem with the mounter. However, with conventional component supply devices, sufficient space for an operator to be able to access the mounter is not maintained.

Means for Solving the Problem

The component supply device disclosed in this specification includes a replenishment section provided with a magazine which houses a component carrying member and a conveyance section which conveys a component carrying member housed in the magazine. Also, a feature is that a replenishment section is slidably attached with respect to a conveyance section.

With this component supply device, a replenishment section can be slid with respect to a conveyance section. Due to this, when an operator must access the mounter, the replenishment section can be moved by sliding with respect to the conveyance section and the space can be widened to allow the operator to access the mounter. Conversely, when the operator does not require access to the mounter, the replenishment section can be positioned at an appropriate position for conveying a component carrying member.

A top view of the component mounting system of an embodiment.

FIG. 2

Figure 1:
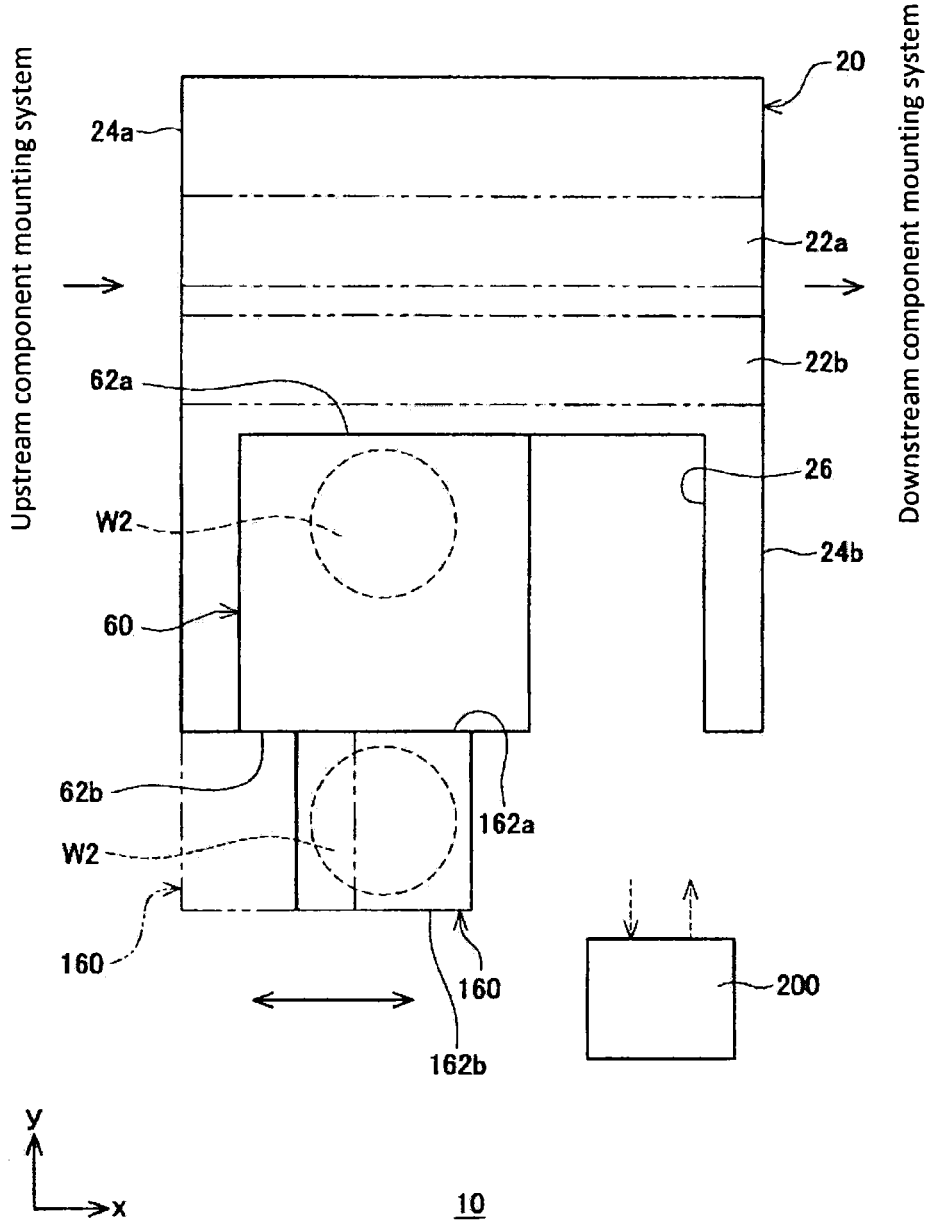
FIG. 1

A diagram to illustrate an outline configuration of the component supply device equipped in the component mounting system of FIG. 1.

FIG. 3

Diagram showing the attachment structure provided on the attachment surface of the wafer sheet replenishment section.

FIG. 4

Diagram showing the attachment structure provided on the attachment surface of the wafer sheet conveyance section.

FIG. 5

Figure 4:
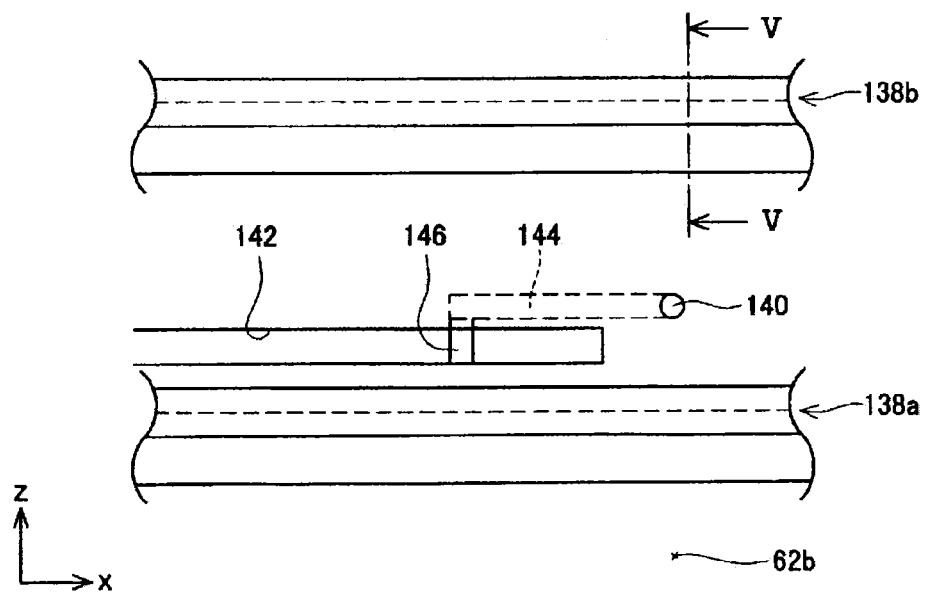

Diagram showing the attachment structure of the wafer sheet replenishment section and wafer sheet conveyance section from a cross section through the line V-V of FIG. 4.

FIG. 6

Figure 3:
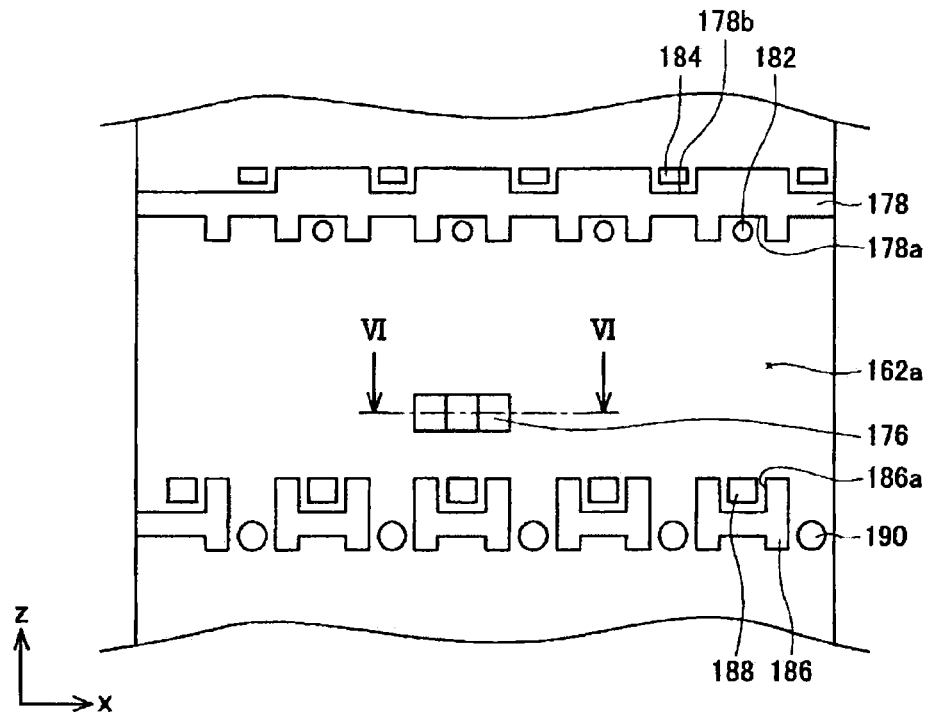

Diagram showing the attachment structure of the wafer sheet replenishment section and wafer sheet conveyance section from a cross section through the line VI-VI of FIG. 3.

FIG. 7

A front view schematically showing the structure of the moving table.

FIG. 8

Top view of the wafer table.

FIG. 9

Diagram showing both the state before rotation and the state after rotation of the wafer table.

FIG. 10

Diagram showing schematically the relationship between the moving table, pickup head, and mounting head during face-down supply.

FIG. 11

Side view of pickup head (in a state with nozzles positioned at the pickup position)

FIG. 12

Side view of pickup head (in a state with nozzles positioned at the transfer position)

FIG. 13

Diagram showing the mechanism to flip the pickup nozzles of the pickup head (in a state with nozzles positioned at the pickup position).

FIG. 14

Diagram showing the mechanism to flip the pickup nozzles of the pickup head (in a state with nozzles positioned at the transfer position).

FIG. 15

Diagram illustrating the path of the cam follower.

FIG. 16

Diagram showing the configuration of the axis section of the pickup head.

FIG. 17

Top view of wafer sheet.

FIG. 18

Flowchart showing the operation of the component mounting device when mounting components from a wafer sheet onto a board.

DETAILED DESCRIPTION

The component supply device of an embodiment of the technology disclosed in this specification may be arranged adjacent to a mounter which mounts components on a board to supply components to the mounter. This component supply device may have a replenishment section provided with a magazine which houses a component carrying member on which multiple components are arranged on a base material, and a conveyance section which conveys a component carrying member housed in the magazine. The conveyance section may be provided with side surface number one to which a replenishment section is attached, and side surface number two adjacent to which is arranged a mounter. In this case, the replenishment section may be slidably attached to side surface number one of the conveyance section. Note that examples of a component carrying member are a wafer sheet which carries multiple components on the upper surface of a wafer (an example of a base material), and a tray member which is provided with multiple cavities in the upper surface of the tray (an example of a base material) and in which a component (for example, a component with leads and so on) is housed in those multiple cavities, and so on. Note that the tray member may be conveyed being carried on a pallet.

With this component supply device, by sliding the replenishment section with respect to side surface number one of the conveyance section, the space for an operator to access the mounter can be widened.

With the component supply device of the above embodiment, side surface number one may be positioned in direction number one with respect to the center of the conveyance section. Also, side surface number two may be positioned on the opposite side to direction number one with respect to the center of the conveyance section. And, the replenishment section may be slidable in direction number two within the width of direction number two which is perpendicular to direction number one of the mounter.

According to this kind of configuration, the replenishment section, conveyance section, and mounter are arranged in a line in one direction (that is, in the opposite direction to direction number one). Due to this, when conveying a component carrying member from the replenishment section to the mounter using the conveyance section, conveying the component carrying member in only one direction is sufficient. It follows that, a component carrying member can be conveyed efficiently towards a mounter. On the other hand, because the replenishment section, the conveyance section, and mounter are arranged lined up in one direction, the replenishment section gets in the way when trying to access the mounter from the component supply device side. However, by sliding the replenishment section with respect to the conveyance section in direction number two (that is, the direction perpendicular to direction number one), the space for an operator to access the mounter can be widened. Also, because the range in which the replenishment section can be slid fits within the width of the mounter (the width of direction number two), the increase in size of the installation space of the component mounting system (a system configured from the mounter and component supply device) is controlled.

Also, with the component supply device of the above embodiment, the replenishment section may be slidable in direction number two within a range in which it is not separated from the conveyance section (that is, within a range in which overlapping sections exists between the side surface of the conveyance section side of the replenishment section and the side surface of the replenishment section side of the conveyance section). According to this kind of configuration, because the replenishment section and the conveyance section are not separated, both can be treated as one body.

Also, with the component supply device of the above embodiment, the width of direction number two of the conveyance section may be half or greater than the width of direction number two of the mounter. In this case, the replenishment section may be slidable with respect to the conveyance section in direction number two within the width of direction number two of the mounter. According to this kind of configuration, because the width of direction number two of the conveyance section is relatively large with respect to the mounter, maintaining space to access the mounter is difficult. It follows that, by making the replenishment section slidable with respect to the conveyance section, space to access the mounter can be efficiently maintained.

Note that, the mounter to which the component supply device of the above embodiment is adjacent may be provided with a board conveyance section which conveys boards in direction number two. And, along with a mounter number two being able to be arranged at the upstream end of the board conveyance section, a mounter number three may be able to be arranged at the downstream end of the board conveyance section. In this case, movement range for the sliding movement of the replenishment section with respect to side surface number one may be within the region which does not interfere with mounter number two and mounter number three.

According to this kind of configuration, in cases in which other mounters are arranged upstream and downstream of the mounter, even if the replenishment section is slid with respect to the conveyance section, the replenishment section can be prevented from interfering with the mounter arranged upstream and downstream.

Embodiment 1

Component mounting system 10 of the embodiment will be described using the figures. As shown in FIG. 1, component mounting system 10 includes a component supply device (60, 160), a mounter 20 arranged adjacent to the component supply device (60, 160), and control device 200 which controls the component supply device (60, 160) and mounter 20. First, the overall outline configuration of component mounting system 10 is described based on FIG. 1.

The component supply device (60, 160) includes wafer sheet replenishment section 160 and wafer sheet conveyance section 60. Wafer sheet W2 is replenished by an operator to wafer sheet replenishment section 160. The replenishment of wafer sheet W2 is performed from side surface 162b of the side opposite to the direction in which wafer sheet conveyance section 60 is provided. Wafer sheet conveyance section 60 unloads wafer sheet W2 replenished by an operator from wafer sheet replenishment section 160.

Figure 17:
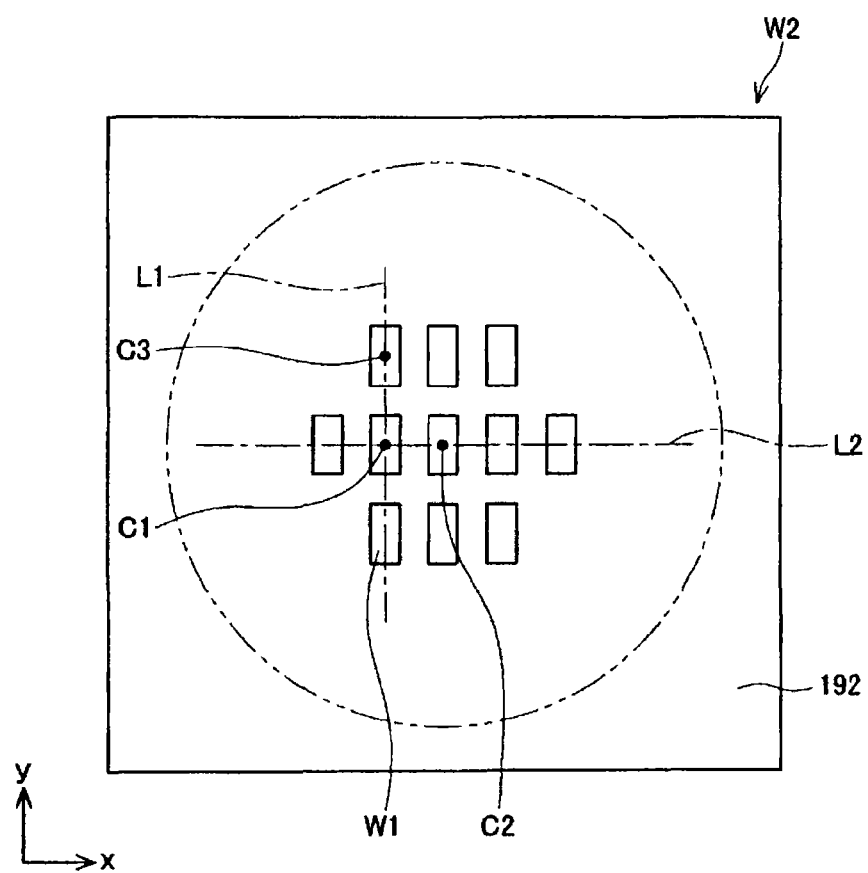

As shown in FIG. 17, wafer sheet W2 is provided with multiple components W1 arranged on sheet 192. Multiple components W1 are arranged in a specific pattern, that is, in the present embodiment, with a gap between each in the x direction and y direction. It follows that, straight line L1 which goes through the center (for example, C1, C3) of multiple components W1 distributed in the y direction extends in the y direction; and straight line L2 which goes through the center (for example, C1, C2) of multiple components W1 distributed in the x direction extends in the x direction. These straight lines L1 and L2 are used to calculate the skew of wafer sheet W2.

Returning to FIG. 1, wafer sheet conveyance section 60 is arranged adjacent to side surface 162a of the mounter side of wafer sheet replenishment section 160. As given below, wafer sheet replenishment section 160 is slidably attached with respect to side surface 62b of wafer sheet conveyance section 60. Wafer sheet conveyance section 60 conveys wafer sheet W2 unloaded from wafer sheet replenishment section 160 to a component supply position near mounter 20 (a position near mounter 20).

Mounter 20 is arranged adjacent to side surface 62a of wafer sheet conveyance section 60 (that is, the side surface on the opposite side to the wafer sheet replenishment section 160 side). Specifically, recess section 26 is provided in the surface on the wafer sheet conveyance section 60 side of mounter 20, and wafer sheet conveyance section 60 is housed inside this recess section 26. And, mounter 20 is arranged with respect to wafer sheet conveyance section 60 such that side surface 62a of wafer sheet conveyance section 60 contacts the bottom surface of recess section 26 of mounter 20. Note that, when mounter 20 is arranged with respect to wafer sheet conveyance section 60, a space is formed at the right side of wafer sheet conveyance section 60. A loading table (for example, a feeder device table) on which is loaded another component supply device (for example, a feeder) and so on not shown in the figures is installed in this space. Mounter 20 includes board conveyance sections 22a and 22b which convey boards. An upstream component mounting system is arranged at left side surface 24a of mounter 20. A downstream component mounting system is arranged at right side surface 24b of mounter 20. Boards on which components have been mounted at the upstream component mounting system are supplied to board conveyance sections 22a and 22b. A board supplied to board conveyance sections 22a and 22b is sent to the center of mounter 20. Mounting head 30 of mounter 20 picks up component W1 from wafer sheet W2 conveyed to a component supply position by wafer sheet conveyance section 60 and mounts picked up component W1 on a board on board conveyance section 22a, 22b. The board on which component W1 was mounted, is sent to a downstream component mounting system by board conveyance sections 22a, 22b. By passing the board through multiple component mounting systems, the required components can be attached to the board. Note that, an upstream component mounting system may be arranged at right side surface 24b of mounter 20 and a downstream component mounting system may be arranged at left side surface 24a of mounter 20. In this case, boards are conveyed from right side surface 24b to left side surface 24a of mounter 20.

(Wafer Sheet Replenishment Section 160)

Figure 2:
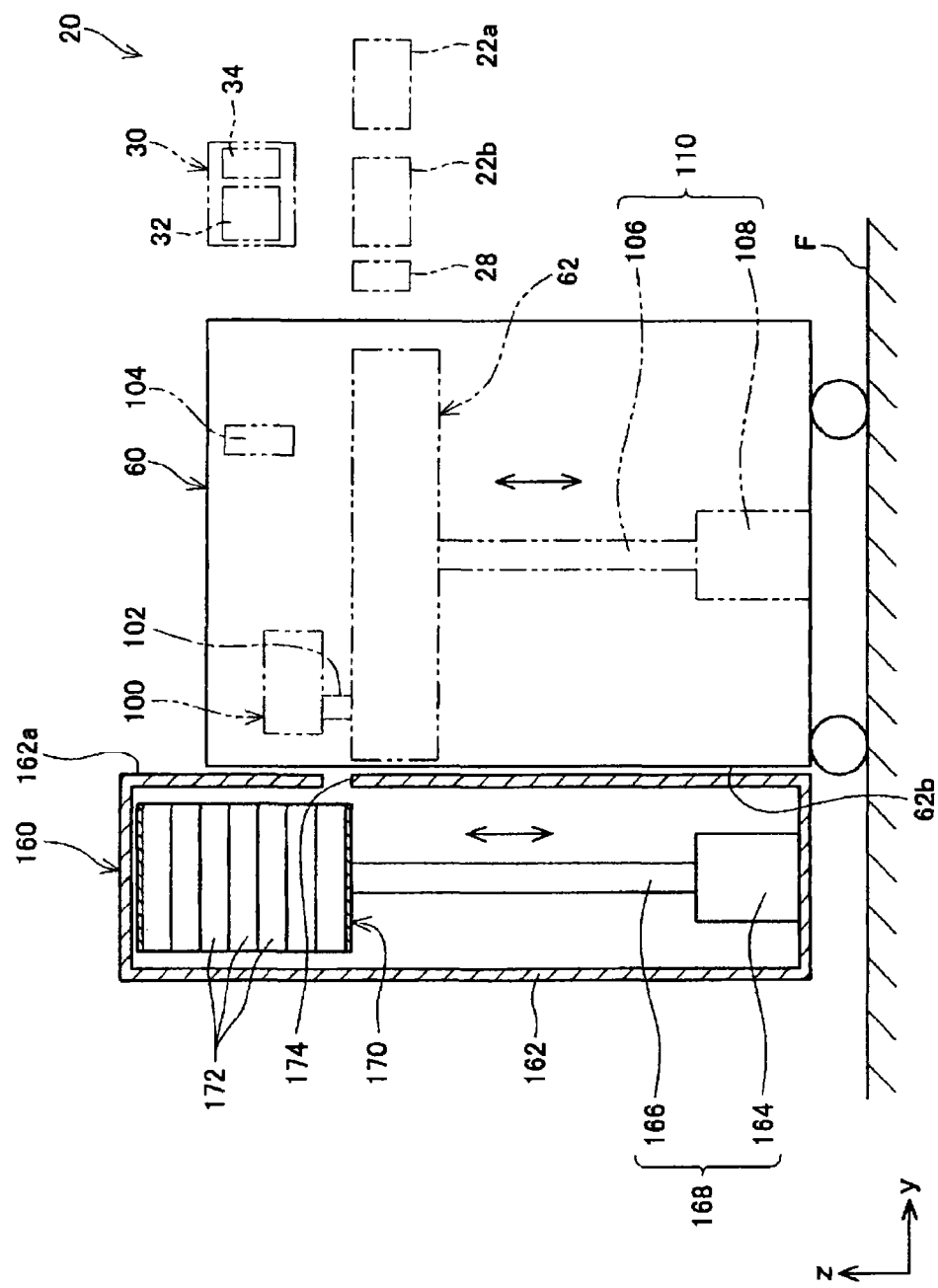

Next, details are described of each section of component mounting system 10. First, wafer sheet replenishment section 160 is described. As shown in FIG. 2, wafer sheet replenishment section 160 is provided with housing 162, magazine 170, and raising/lowering mechanism 168.

Housing 162 houses magazine 170 and raising/lowering mechanism 168. Unloading hole 174 for unloading wafer sheet W2 is formed in side surface 162a on the wafer sheet conveyance section 60 side of housing 162. Also, a slide mechanism (described below) for sliding wafer sheet replenishment section 160 with respect to wafer sheet conveyance section 60 is provided between side surface 162a of housing 162 and side surface 62b of wafer sheet conveyance section 60.

Magazine 170 is provided with multiple wafer sheet housing sections 172 which house wafer sheet W2. Multiple wafer sheet housing sections 172 are stacked in the height direction (z direction). Wafer sheet W2 is housed in each wafer sheet housing section 172. Magazine 170 is formed such that the x-z cross-section is a rectangular tube. That is, the rear end of magazine 170 (the end on the opposite side to wafer sheet conveyance section 60) and the front end of magazine 170 (the end on the wafer sheet conveyance section 60 side) are open. Due to this, an operator can replenish wafer sheet W2 to wafer sheet housing section 172 from the rear end of magazine 170. On the other hand, wafer sheet W2 stored in wafer sheet housing section 172 can be unloaded to wafer sheet conveyance section 60 from the front of magazine 170.

Raising/lowering mechanism 168 includes ball screw 166 and motor 164 which rotates ball screw 166. A nut (not shown in the figures) which engages with ball screw 166 is fixed to magazine 170. Due to this, when ball screw 166 is rotated by motor 164, magazine 170 moves up/down inside housing 162. By moving magazine 170 up/down, any wafer sheet housing section 172 inside magazine 170 can be aligned with the height of unloading hole 174 of housing 162. By this, wafer sheet W2 can be unloaded from wafer sheet housing section 172 to wafer sheet conveyance section 60 through unloading hole 174. Note that, the conveyance of wafer sheet W2 from wafer sheet housing section 172 to wafer sheet conveyance section 60 is performed by a robot not shown in the figures.

Here, the slide mechanism for sliding wafer sheet replenishment section 160 with respect to wafer sheet conveyance section 60 is described. The slide mechanism includes slide blocks 178 and 186 and so on provided in side surface 162a of wafer sheet replenishment section 160, and engagement grooves 138a and 138b and so on formed in side surface 62b of wafer sheet conveyance section 60.

As shown in FIG. 3, number one slide block 178 extending in the x direction, and multiple number two slide blocks 186 arranged at intervals in the z direction with respect to number one slide block 178, are provided on side surface 162a of wafer sheet replenishment section 160 (that is, side surface 162a of housing 162).

Multiple recess sections 178a which house guide roller 182, and multiple recess sections 178b which house guide roller 184, are formed in number one slide block 178. Guide roller 182 is rotatable about a rotation axis which is parallel to the y axis (an axis perpendicular to the surface of the page). Guide roller 184 is rotatable about a rotation axis which is parallel to the z axis. Number one slide block 178 is fixed to side surface 162a of housing 162 via base block 180 (refer to FIG. 5).

Multiple number two slide blocks 186 are arranged in the x direction with intervals between each other. The direction in which multiple number two slide blocks 186 are arranged is parallel to the direction in which number one slide block 178 extends. Multiple number two slide blocks 186 are also fixed to side surface 162a of housing 162 via a base block not shown in the figures. Recess section 186a which houses guide roller 188 is formed in each number two slide block 186. Guide roller 188 is rotatable about a rotation axis which is parallel to the z axis. Guide roller 190 is arranged between adjacent number two slide blocks 186. Guide roller 190 is rotatable about a rotation axis which is parallel to the y axis (an axis perpendicular to the surface of the page).

Engagement block 176 is arranged at an intermediate position in the height direction of number one slide block 178 and number two slide blocks 186. Engagement block 176 is fixed to side surface 162a of housing 162. In the center section of engagement block 176, recess groove 176a is formed (refer to FIG. 6). Recess groove 176a is recessed from the wafer sheet conveyance section 60 side to the wafer sheet replenishment section 160 side.

Figure 5:
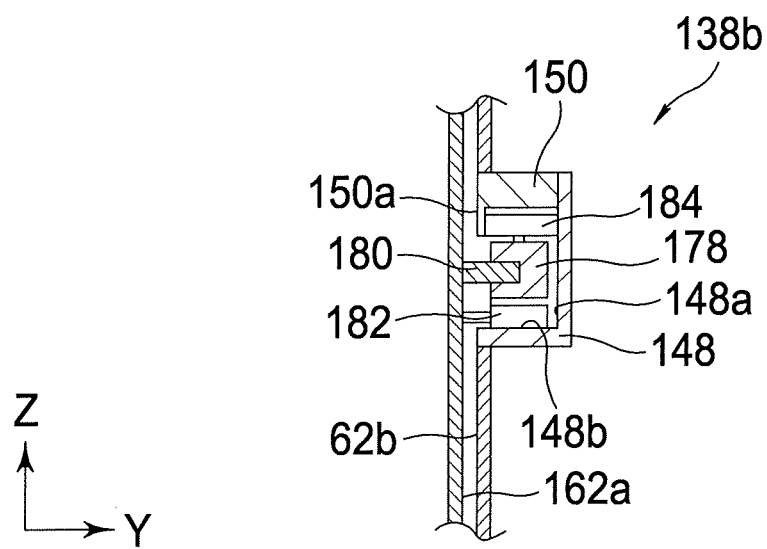

As shown in FIG. 4, number one engagement groove 138b in which number one slide block 178 is housed, and number two engagement groove 138a in which number two slide blocks 186 are housed, are formed in side surface 62b of wafer sheet conveyance section 60. Number one engagement groove 138b and number two engagement groove 138a extend in the x direction (i.e. a first direction). As shown in FIG. 5, number one engagement groove 138b is configured from number one frame member 148 and number two frame member 150 attached to the upper end of number one frame member 148. Number one slide block 178 and guide rollers 182 and 184 are housed in the space surrounded by number one frame member 148 and number two frame member 150. Guide roller 182 contacts surface 148b which extends in they direction (i.e. a second direction) of number one frame member 148. Due to this, a force acts in the z direction between guide roller 182 and number one frame member 148. As given above, guide roller 182 is rotatable about a rotation axis which is parallel to the y axis (i.e. the second direction). Due to this, wafer sheet replenishment section 160 is supported in the z direction by guide roller 182 while being slidable in the x direction (the first direction being perpendicular to the surface of the page) with respect to wafer sheet conveyance section 60. Guide roller 184, as well as contacting surface 148a which extends in the z direction of number one frame member 148, contacts protrusion 150a of number two frame member 150. Due to this, a force acts in they direction between guide roller 184 and frame members 148 and 150. As given above, guide roller 184 is rotatable about a rotation axis which is parallel to the z axis. Due to this, wafer sheet replenishment section 160 is supported in the y direction by guide roller 184 while being slidable in the x direction with respect to wafer sheet conveyance section 60. Note that in FIG. 5 guide roller 182 and guide roller 184 are shown, but actually, as in FIG. 3, the position in the x direction of guide roller 182 and guide roller 184 is not the same. It should be borne in mind that in FIG. 5, for convenience of description, guide roller 182 and guide roller 184 are shown in the same figure.

Number two engagement groove 138a is configured in the same way as number one engagement groove 138b. That is, number two slide blocks 186 and guide rollers 188 and 190 are housed inside number two engagement groove 138a, and guide rollers 188 and 190 contact the inside surface of number two engagement groove 138a. Wafer sheet replenishment section 160 is supported in the y direction and z direction with respect to wafer sheet conveyance section 60 by guide rollers 188 and 190.

As shown in FIG. 4, guidance groove 142 is formed in side surface 62b of wafer sheet conveyance section 60. Guidance groove 142 is positioned between number one engagement groove 138b and number two engagement groove 138a, and extends in the x direction. Lock pin 146 is arranged inside guidance groove 142. Lock pin 146 is connected to one end of link member 144. The other end of link member 144 is connected to release button 140. Lock pin 146 is biased towards the position shown by the solid line in FIG. 6 by a biasing means (for example, a spring) not shown in the figure. When an operator operates release button 140, lock pin 146 retracts to the position shown by the dotted line in FIG. 6.

Engagement block 176 of wafer sheet replenishment section 160 is arranged inside the above guidance groove 142. The range in which wafer sheet replenishment section 160 is slidable with respect to wafer sheet conveyance section 60 is regulated by the arrangement of engagement block 176 inside guidance groove 142. By this, the undesirable disconnection of wires which connect apparatuses on the wafer sheet replenishment section 160 side and apparatuses of the wafer sheet conveyance section 60 side can be prevented.

Also, lock pin 146 is engagable with recessed groove 176a of engagement block 176 arranged inside guidance groove 142. By lock pin 146 engaging with recessed groove 176a of engagement block 176, wafer sheet replenishment 160 becomes unable to be slid with respect to wafer sheet conveyance section 60. In the present embodiment, unloading of wafer sheet W2 from wafer sheet replenishment section 160 to wafer sheet conveyance section 60 is only possible when wafer sheet replenishment section 160 is in a state not slidable with respect to wafer sheet conveyance section 60. By this, the unloading of wafer sheet W2 from wafer sheet replenishment section 160 to wafer sheet conveyance section 60 at a wrong position can be prevented.

Figure 6:
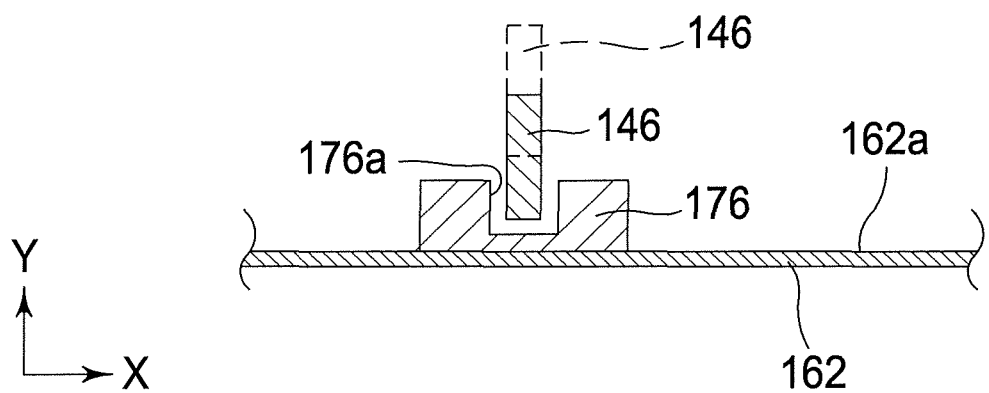

Conversely, when an operator operates release button 140, lock pin 146 is removed from recessed groove 176a of engagement block 176 (lock pin 146 retracts to the position indicated by the dotted line in FIG. 6). By this, wafer sheet replenishment section 160 becomes slidable with respect to wafer sheet conveyance section 60. It follows that, when wafer sheet replenishment section 160 is to be slid, an operator just needs to operate release button 140 and push wafer sheet replenishment section 160 in the sliding direction.

Note that, as in FIG. 1, wafer sheet replenishment section 160 is slidable in the x direction (that is, the direction perpendicular to the direction in which wafer sheet W2 is supplied [y direction]) with respect to wafer sheet conveyance section 60. And, the range in which wafer sheet replenishment section 160 is slidable in the present embodiment is the range from the position shown by the solid lines to the position shown by the dashed lines in FIG. 1, which is inside the x direction width of mounter 20. Due to this, even if wafer sheet replenishment section 160 is slid, wafer sheet replenishment section 160 does not interfere with an upstream component mounting system, nor does wafer sheet replenishment section 160 interfere with a downstream component mounting system. Also, as is clear from FIG. 1, in the position shown by the dashed lines with wafer sheet replenishment section 160 slid to the left, side surface 62b of wafer conveyance section 60 is widely open. Due to this, when errors and the like occur with mounter 20, an operator can operate release button 140 and slide wafer sheet replenishment 160 to maintain sufficient space to access mounter 20. Because there is no need to provide space in advance to access mounter 20, component mounting system 10 can be made compact.

(Wafer Sheet Conveyance Section 60)

Next, wafer sheet conveyance section 60 is described. As shown in FIG. 2, wafer sheet conveyance section 60 includes moving table 62, table raising/lowering mechanism 110 which raises/lowers moving table 62, pickup head 100 which is movable in the xy direction with respect to moving table 62, and camera 104 for taking an image of wafer sheet W2 loaded on moving table 62.

Figure 7:
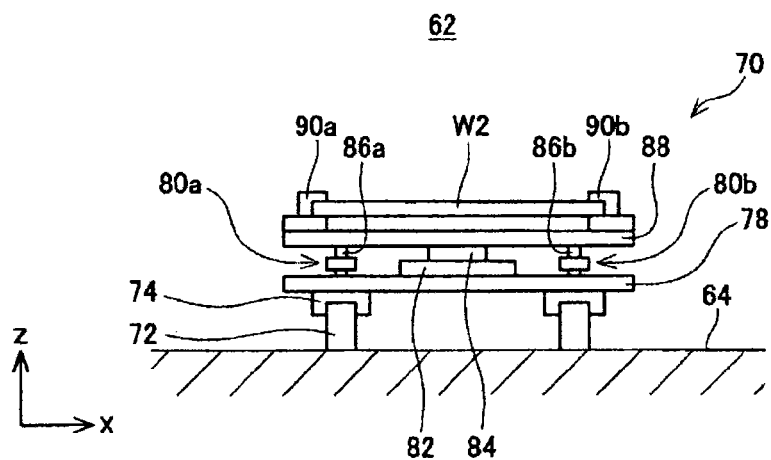

As shown in FIG. 7, moving table 62 includes base 64, slider 78 which slides with respect to base 64, and wafer table 88 which rotates with respect to slider 78. Base 64 is movable in the up/down direction by table raising/lowering mechanism 110. That is, as shown in FIG. 2, table raising/lowering mechanism 110 includes ball screw 106, and motor 108 to rotate ball screw 106. Nut (not shown in the figures) which engages with ball screw 108 is fixed to base 64. Due to this, when ball screw 106 is rotated by motor 108, base 64 moves in the up/down direction. By base 64 being moved in the up/down direction, wafer table 88 is also moved in the up/down direction.

Slider 78 is supported slidably in the y direction with respect to base 64. Specifically, guide 72 is provided on the upper surface of base 64. Guidance section 74 of slider 78 engages with guide 72. Due to this, slider 78 is supported movable in the y direction with respect to base 64. The movement of slider 78 is performed by a ball screw mechanism and motor for rotating the ball screw mechanism which are not shown in the figures.

Figure 8:
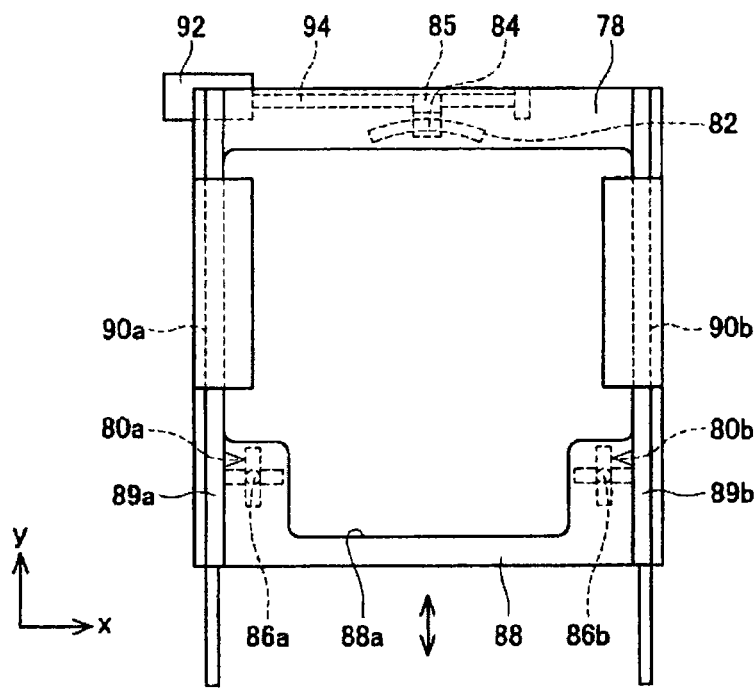
Figure 9:
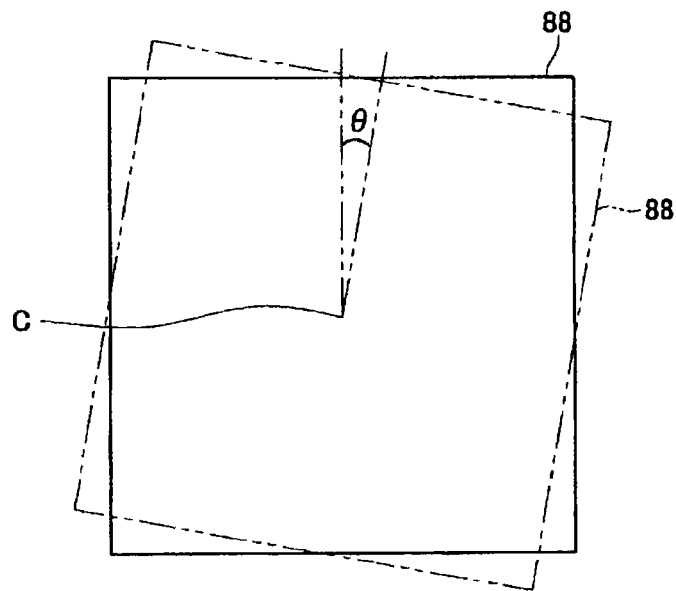

As shown in FIGS. 7 and 8, wafer table 88 is rotatably supported around a rotation axis (hereafter, θ axis [specifically, the axis extending in the z direction passing through point C shown in FIG. 9]) extending in the z direction on slider 78. Specifically, R guide 82 is provided on the border of the mounter 20 side of slider 78. Slider 84 is attached to the underside of wafer table 88 and slider 84 is guided by R guide 82. Also, cross guides 80a and 80b are provided on the border of the left and right of slider 78. Support points 86a and 86b set on the underside of wafer table 88 are supported by cross guides 80a and 80b (in detail, by a ball bearing of cross guides 80a and 80b). It follows that, wafer table 88 is supported on slider 78 at three points: the position at which slider 84 is provided, support point 86a, and support point 86b.

Here, the three points at which slider 84, support point 86a, and support point 86b are provided are set such that they are on the circumference of the same circle which includes point C as its center as shown in FIG. 9. That is, wafer table 88 is supported by three points on the same circumference with point C at its center (θ axis). Also, the curvature of R guide 82 is set such that slider 84 moves this circumference of the same circle with point C (θ axis) at its center. Due to this, when slider 84 moves in an arc around the θ axis guided by R guide 82, support points 86a and 86b also move in an arc around the θ axis guided by cross guides 80a and 80b. As a result, wafer table 88 moved about the θ axis.

In the present embodiment, a ball screw mechanism (94, 85) is used to rotate wafer table 88 about the θ axis. That is, as shown in FIG. 8, ball screw 94 is rotatably supported at the border of the mounter 20 side of slider 78. The output axis of motor 92 is fixed to an end of ball screw 94, and ball screw 94 is rotated by motor 92. Ball screw 94 extends in the x direction and is engaged with nut member 85. Nut member 85 and slider 84 are connected such that they move as one in the x direction and can change relative position in the y direction. It follows that, when ball screw 94 is rotated by motor 92, nut member 85 moves in the x direction following ball screw 94. Slider 84 moves in the x direction while being guided by R guide 82 according to the x direction movement of nut member 85. By this, as shown in FIG. 9, wafer table 88 rotates about the θ axis.

A loading surface on which wafer sheet W2 is loaded is formed on the above wafer table 88. As shown in FIG. 8, opening 88a is formed in the center of the loading surface of wafer table 88. By opening 88a being formed in the center of the loading surface, it is possible to arrange a mechanism which pushes up wafer sheet W2 on the side under wafer sheet W2. By pushing up wafer sheet W2 from the underside, component W1 can be easily picked up from wafer sheet W2. Note that, an image of wafer sheet W2 loaded on wafer table 88 can be captured by camera 104 fixed on moving mechanism 102.

Also, as shown in FIGS. 7 and 8, clamp attachment sections 89a and 89b which extend in the y direction are provided on the border of the left and right of wafer table 88. Wafer clamps 90a and 90b are attached to clamp attachment sections 89a and 89b. Wafer sheet W2 is clamped by wafer clamps 90a and 90b such that wafer sheet W2 is held on wafer table 88.

Figure 11:
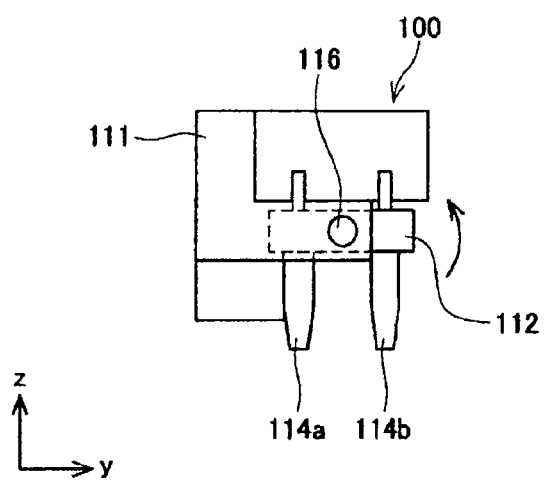
Figure 12:
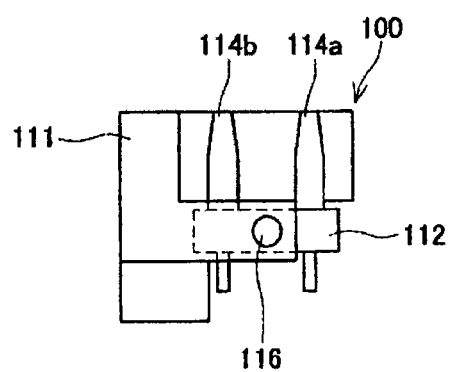

Next, pickup head 100 is described. As shown in FIGS. 11 and 12, pickup head 100 includes number one housing 111, rotation axis 116 which is rotatably supported with respect to number one housing 111, and number two housing 112 which is fixed to rotation axis 116. Multiple suction nozzles 114a and 114b are attached to number two housing 112. The arrangement of multiple suction nozzles 114a and 114b corresponds to the arrangement of multiple suction nozzles 32 equipped on mounting head 30 of mounter 20. Because multiple suction nozzles 114a and 114b are attached to number two housing 112, when number two housing 112 is rotated together with rotation axis 116, suction nozzles 114a and 114b move between a pickup position at which the tip of suction nozzles 114a and 114b faces down (the state in FIG. 11), and a transfer position at which the tip of suction nozzles 114a and 114b faces up (the state in FIG. 12).

Figure 13:
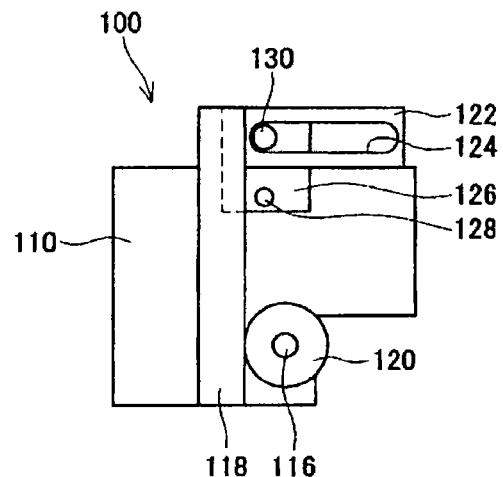
Figure 14:
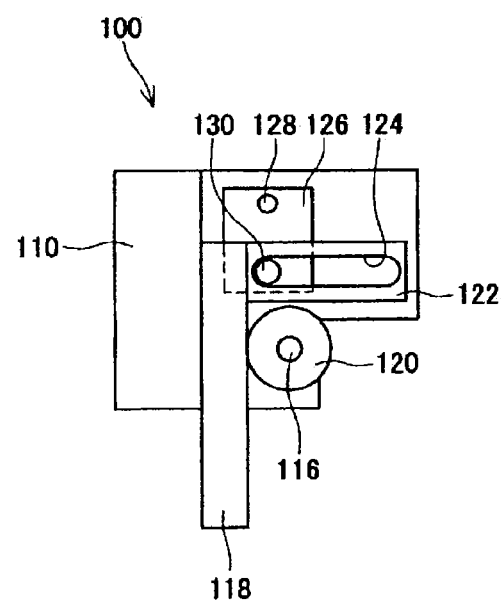

As shown in FIGS. 13 and 14, pickup head 100 is provided with a mechanism (118, 120, and so on) for switching suction nozzles 114a and 114b between the pickup position and the transfer position. That is, rack 118 is attached movably in the up/down direction on number one housing 110. Pinion gear 120 is engaged with rack 118. Pinion gear 120 is fixed to rotation axis 116. It follows that, by moving rack 118 up/down, pinion gear 120 and rotation axis 116 rotate, and suction nozzles 114a and 114b move between the pickup position and the transfer position.

The above up/down movement of rack 118 is performed by rotation member 126 being rotated about support axis 128. That is, cam follower 122 is attached to the upper end of rack 118. Guidance groove 124 is formed in cam follower 122. Pin 130 is engaged with guidance groove 124 of cam follower 122 and pin 130 is fixed to an end of rotation member (cam member) 126. Due to this, when rotation member 126 is rotated about support axis 128 by an actuator which is not shown in the figures (for example, an air cylinder), pin 130 also moves according to the rotation of rotation member 126. By this, cam follower 122 to which pin 130 is also engaged moves in the up/down direction and rack 118 moves in the up/down direction.

Figure 15:
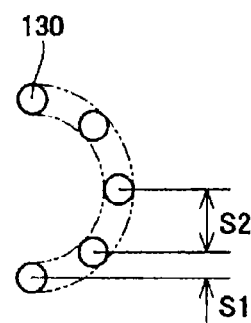

As is clear from the above description, the moving speed in the up/down direction of cam follower 122 (that is, rack 118) is slow when suction nozzles 114a and 114b are near the pickup position and the transfer position, and fast when suction nozzles 114a and 114b are between the pickup position and the transfer position. That is, as shown in FIG. 15, when suction nozzles 114a and 114b are near the pickup position and the transfer position, the up/down direction movement amount S1 is small with respect to the change in the rotation angle of pin 130. Conversely, when suction nozzles 114a and 114b are between the pickup position and the transfer position, up/down direction movement amount S2 is large with respect to the change in the rotation angle of pin 130. Due to this, by using the above cam mechanism (122, 126, 130), the rotation speed of number two housing 112 when suction nozzles 114a and 114b are near the pickup position and the transfer position can be made low. By this, the impact when number two housing 112 stops rotating can be reduced.

Figure 16:
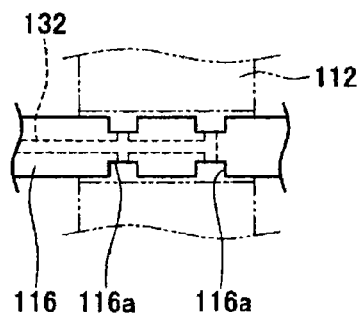

Note that, as shown in FIG. 16, intake passage 132 is formed in rotation axis 116 of pickup head 100. Groove 116a is formed on the outer peripheral surface of rotation axis 116 and an end of intake passage 132 is connected to the bottom surface of groove 116a. Also, the intake passage of suction nozzles 114a and 114b is connected to groove 116a of rotation axis 116. It follows that, suction nozzles 114a and 114b are connected to a suction device via groove 116a and intake passage 132. By providing intake passage 132 inside rotation axis 116, intake piping to suction nozzles 114a and 114b can be made unnecessary.

Also, pickup head 100 and camera 104 are movable in the xy direction with respect to moving table 62 by moving mechanism 102 attached to moving table 62. By this, component W1 loaded at any position on wafer sheet W2 can be picked up by pickup head 100 and an image of component W1 can be taken by camera 104. A well-known mechanism (for example, a ball screw mechanism and so on) can be used for moving mechanism 102. Note that, as is clear from the above description, pickup head 100 and camera 104 are attached to moving table 62 via moving mechanism 102. Due to this, when moving table 62 is moved in the up/down direction by table raising/lowering mechanism 110, pickup head 100 and camera 104 also move in the up/down direction correspondingly.

(Mounter 20)

Next, mounter 20 is described. Note that, as conventional well-known items can be used for mounter 20, here the configuration of mounter 20 is described simply. As is shown in FIG. 2, mounter 20 includes board conveyance sections 22*a* and 22*b*, mounting head 30, and component camera 28. Board conveyance sections 22*a* and 22*b* convey boards which are loaded on a conveyor belt by rotating the conveyor belt. Mounting head 30 is provided with multiple suction nozzles 32 for picking up component W1, and mark camera 34 for reading fiducial marks of wafer sheet W2. The arrangement of suction nozzles 32 of mounting head 30 corresponds to the arrangement of pickup nozzles 114*a* and 114*b* of pickup head 100. That is, mounting head 30 can receive multiple components W1 being held on suction nozzles 114*a* and 114*b* of pickup head 100 at the same time. Note that, mounting head 30 is movable in the xy direction by an x-direction moving mechanism and a y-direction moving mechanism not shown in the figures. Component camera 28 performs reading and so on of components W1 picked up by mounting head 30.

Figure 18:
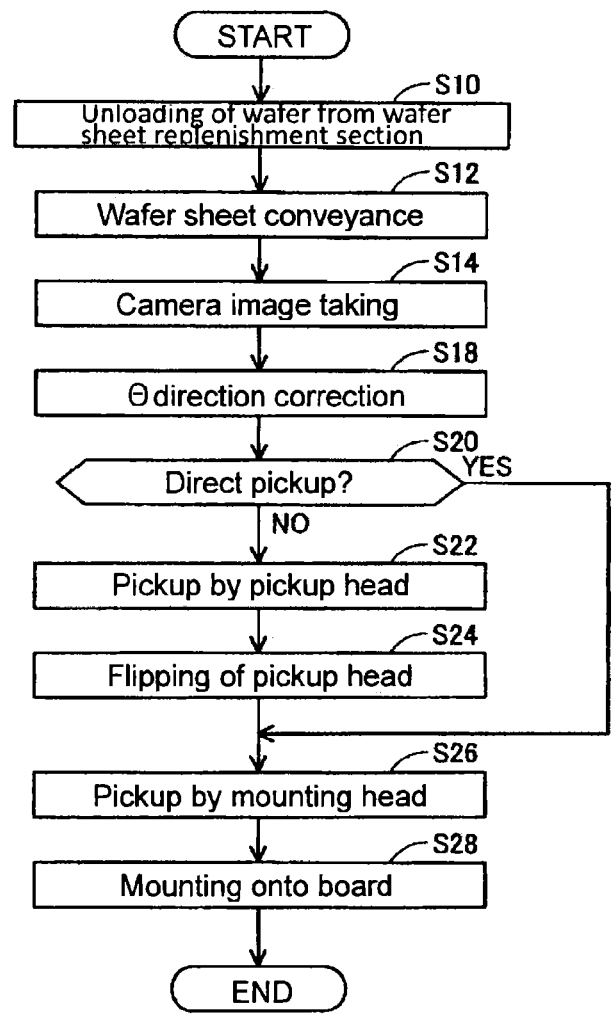

Next, the operation of the above component mounting system 10 is described with reference to FIG. 18. As shown in FIG. 18, first, wafer sheet W2 is conveyed from wafer sheet replenishment section 160 (S10). Specifically, control device 200 drives raising/lowering mechanism 168 and positions one of the wafer sheet housing sections 172 at unloading hole 174. Also, control device 200 drives moving table 62 and positions wafer table 88 at the wafer sheet loading position (a position near wafer sheet replenishment section 160). The wafer sheet loading position is the position to which wafer sheet W2 is unloaded from unloading hole 174 of wafer sheet replenishment section 160, and is set near unloading hole 174 of wafer sheet replenishment section 160. Next, control device 200 drives a robot and loads wafer sheet W2 housed in wafer housing section 172 onto the loading surface of wafer table 88.

When wafer sheet W2 has been loaded onto wafer table 88, control device 200 drives moving table 62 and positions wafer table 88 at the component supply position (a position near mounter 20) (S12). The component supply position is set near mounter 20 and is a position at which supply of component W1 to mounting head 30 from wafer sheet W2 is performed.

Next, control device 200 takes an image of wafer sheet W2 loading on wafer table 88 by camera 104 (S14). When an image of wafer sheet W2 has been taken, control device 200 calculates the deviation amount in the θ direction of wafer sheet W2 from that taken image. That is, replenishment of wafer sheet W2 to wafer sheet housing section 172 is performed by an operator, and the loading of wafer sheet W2 from wafer sheet housing section 172 to wafer table 88 is performed by a robot. It follows that, there are cases in which wafer sheet W2 is not loaded on wafer table 88 at the predetermined set angle. Due to this, an image is taken of wafer sheet W2 on wafer table 88 by camera 104 and the deviation amount (deviation in the θ direction [angle deviation]) of wafer sheet W2 is calculated. Note that, the deviation in the θ direction of wafer sheet W2 can be calculated by the procedure below. That is, the center point C1 to C3 of multiple components W1 can be calculated from an image taken by camera 104 as shown in FIG. 17. Then, the θ direction deviation (angle deviation) of wafer sheet W2 is calculated from the slope of straight line L2 which connects center point C1 and center point C2, and of straight line L1 which connects center point C1 and center point C3.

When the deviation amount of wafer sheet W2 has been calculated, control device 200 drives moving table 62 and corrects the position deviation about the θ axis (S18). By this, wafer sheet W2 is positioned at the predetermined orientation (angle).

Next, control device 200 judges whether component W1 on wafer sheet W2 is to be picked up directly by mounting head 30 (S20). That is, control device 200 judges whether component W1 of wafer sheet W2 is to be supplied face-up or face-down. In cases in which direct pickup is to be performed by mounting head 30 (S20 is yes), steps S22 and 24 are skipped and processing proceeds to step S26.

Figure 10:
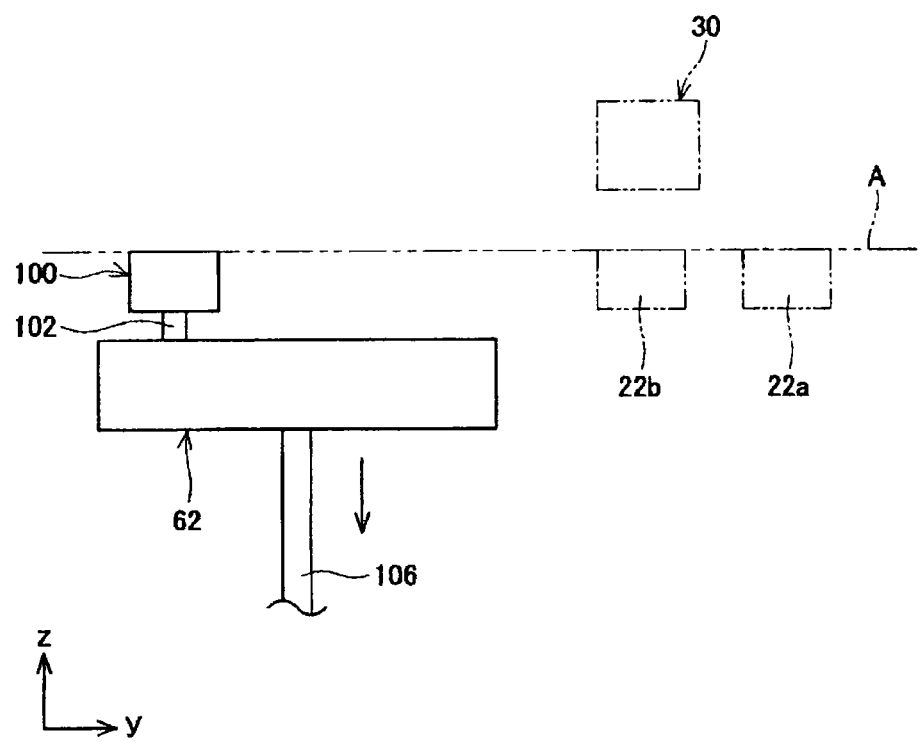

Conversely, in cases in which direct pickup by mounting head 30 of component W1 on wafer sheet W2 is not to be performed (S20 is no), control device 200 drives pickup head 100 and component W1 on wafer sheet W2 is picked up by pickup head 100 (S22). Because pickup head 100 includes multiple suction nozzles 114*a* and 114*b*, multiple components W1 are picked up by pickup head 100. Continuing, control device 200, by rotating number two housing 112 moves pickup nozzles 114*a* and 114*b* of pickup head 100 from the pickup position to the transfer position. Also, control device 200 drives table raising/lowering mechanism 110 and lowers moving table 62. That is, as is clear from FIGS. 2 and 10, pickup head 100 is positioned lower than moving table 62 (specifically, wafer table 88). For this, moving table 62 is lowered such that the tip of pickup nozzles 114*a* and 114*b* is at the height of reference surface A (shown in FIG. 10). Because moving table 62 and pickup head 100 are connected via moving mechanism 102, if moving table 62 is lowered, pickup head 100 can also be lowered. Here, reference surface A is at the position (height) of wafer table 88 when component W1 on wafer sheet W2 is directly picked up by mounting head 30. In the present embodiment, because pickup nozzles 114*a* and 114*b* are positioned at reference surface A, the height at which mounting head 30 picks up component W1 does not change between face-up supply and face-down supply. Due to this, pickup of component W1 by mounting head 30 can be performed easily.

Next, control device 200 picks up component W1 with mounting head 30 (S26). That is, when component W1 on wafer sheet W2 is picked up directly by mounting head 30, component W1 is picked up from wafer sheet W2 on wafer table 88. Conversely, when component W1 is picked up by suction nozzles 114*a* and 114*b* of pickup head 100, component W1 is picked up from pickup nozzles 114*a* and 114*b* of pickup head 100. Here, because the arrangement of suction nozzles 114*a* and 114*b* of pickup head 100 and the arrangement of suction nozzles 32 of mounting head 30 correspond, multiple components W1 can be transferred from pickup head 100 to mounting head 30 at the same time. Note that, it is fine if some of the suction nozzles provided on pickup head 100 and the suction nozzles provided on mounting head 30 correspond such that multiple components W1 can be transferred at the same time. For example, the suction nozzles of pickup head 100 may be arranged in two rows of two (that is, an arrangement lined up with two in the x direction and two in the y direction), and the suction nozzles of mounting head 30 may be arranged in one row of two, such that two components W1 are transferred from pickup head 100 to the mounting head 30 at the same time. Alternatively, the suction nozzles of pickup head 100 may be arranged in one row of two, and the suction nozzles of mounting head 30 may be arranged in two rows of two such that two components W1 are transferred from pickup head 100 to the mounting head 30 at the same time. Further, the suction nozzles of pickup head 100 may be arranged in four rows of two, and the suction nozzles of mounting head 30 may be arranged in two rows of four such that four components W1 are transferred from pickup head 100 to the mounting head 30 at the same time.

When components W1 are picked up by mounting head 30, control device 200 drives mounting head 30 and mounts components W1 picked up by mounting head 30 onto a board on board conveyance section 22*a*, 22*b*. By this, components W1 are mounted onto a board.

As described above, in component mounting system 10 of the present embodiment, because wafer replenishment section 160 is slidable with respect to wafer conveyance section 60, access can be gained to mounter 20 easily. On the other hand, because the range in which wafer replenishment section 160 can be slid is regulated, interference between wafer replenishment section 160 and an adjacent component mounting system can be prevented. As a result, the access area to mounter 20 for operators can be enlarged while controlling the increase in size of component mounting system 10.

Also, with component mounting system 10 of the present embodiment, the angle in the θ direction of wafer sheet W2 loaded on wafer table 88 can be adjusted to a predetermined angle. As a result, the moving distance of mounting head 30 can be shortened such that productivity can be improved. Also, by using R guide 82 and cross guides 80*a* and 80*b* in the mechanism for rotating wafer table 88 about the θ axis, wafer table 88 can be rotated about the θ axis with a simple mechanism.

Also, when supplying component W1 face-down, multiple components W1 can be transferred from pickup head 100 to mounting head 30 at the same time. Due to this, the quantity of transfers of components W1 can be reduced such that productivity can be improved.

The above described details of the present embodiment, but these are only an example and in no way restrict the claims of the present application. The technology given in the claims of the present application includes various changes and modifications to the specific examples illustrated above.

For example, in the above embodiment, wafer sheet replenishment section 160 was slid with respect to wafer sheet conveyance section 60 from a lock position (a position in which lock pin 146 and engagement block 176 are engaged) in only one direction, but, without being restricted to this example, it is acceptable for wafer sheet replenishment section 160 to be slidable with respect to wafer sheet conveyance section 60 in both the left and right directions from the lock position.

Also, for the attachment mechanism for making wafer sheet replenishment section 160 slidable with respect to wafer sheet conveyance section 60, various mechanisms can be used, without being restricted to the linear guide used in the present embodiment.

Further, in the above embodiment, there was a component supply device which conveyed wafer sheets on which components were loaded on the sheet, but the technology disclosed in this specification can also be applied to other component supply devices. For example, the technology disclosed in this specification can also be applied to a component supply device (the device disclosed in Japanese Unexamined Patent Application Publication Number 2011-249704) which conveys a tray member in which multiple cavities are provided in the upper surface of the tray (an example base material) and in which components with leads are housed in those multiple cavities. Note that with this type of device, normally, a tray member is loaded on a pallet and conveyed together with the pallet.

The technical elements described in this specification and the figures can exhibit technical utility alone or in various combinations, and are not limited to the combination disclosed in the claims at the time of application. Also, the examples of the technology in this specification and the figures achieves multiple purposes at the same time but can also exhibit technical utility by achieving one among those purposes.

The invention claimed is:

1. A component supply device which is arranged adjacent to a mounter which mounts components on a board, the component supply device supplying the components to the mounter, comprising:
   a replenishment section provided with a magazine which houses a component carrying member on which multiple components are arranged; and
   a conveyance section including a moving table which conveys the component carrying member and which is equipped with a first side surface to which the replenishment section is attached and a second side surface which is arranged adjacent to the mounter, wherein
   the replenishment section is slidably attached in a first direction to the first side surface of the conveyance section,
   a slide block extends in a second direction outward from a side surface of the replenishment section that faces the first side surface of the conveyance section, the slide block includes first rollers with axes of rotation in the second direction and second rollers with axes of rotation in a third direction which is a height direction of the replenishment section,
   an engagement groove in the first side surface of the conveyance section has a length in the first direction and a depth in the second direction,
   when the slide block slides in the first direction within the engagement groove, the first rollers contact a bottom portion of the engagement groove and the second rollers contact a first side portion and a second side portion of the engagement groove.

2. The component supply device according to claim 1, wherein
   the replenishment section is slidable in the first direction within a width of the conveyance section.

3. The component supply device according to claim 2 wherein the replenishment section is slidable in the first direction within a range in which the replenishment section is not separated from the conveyance section.

4. The component supply device according to claim 2 wherein the width in which the replenishment section is slidable is half or greater than a width of the mounter in the second direction.

5. The component supply device according to claim 1, wherein the component carrying member is a wafer.

6. The component supply device according to claim 1, wherein the slide block is fixed to the side surface of the replenishment section by a base block.

7. The component supply device according to claim 6, wherein a top portion of the engagement groove includes a frame member that includes a protrusion that extends in the third direction and contacts the second rollers of the slide block.

\* \* \* \* \*